United States Patent
Batude et al.

(10) Patent No.: US 11,658,260 B2
(45) Date of Patent: May 23, 2023

(54) METHOD OF MANUFACTURING AN OPTOELECTRONIC DEVICE COMPRISING A PLURALITY OF DIODES

(71) Applicant: Commissariat à l'Énergie Atomique et aux Énergies Alternatives, Paris (FR)

(72) Inventors: Perrine Batude, Grenoble (FR); Hubert Bono, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 17/326,454

(22) Filed: May 21, 2021

(65) Prior Publication Data
US 2021/0376185 A1    Dec. 2, 2021

(30) Foreign Application Priority Data
May 29, 2020    (FR) ...................................... 2005712

(51) Int. Cl.
*H01L 33/00* (2010.01)
*H01L 25/16* (2023.01)
*H01L 27/15* (2006.01)
*H01L 33/48* (2010.01)

(52) U.S. Cl.
CPC .......... *H01L 33/007* (2013.01); *H01L 25/167* (2013.01); *H01L 27/156* (2013.01); *H01L 33/486* (2013.01)

(58) Field of Classification Search
None
See application file for complete search history.

(56) References Cited

U.S. PATENT DOCUMENTS

| 2014/0191246 A1* | 7/2014 | Oraw | H01L 25/167 |
| | | | 438/25 |
| 2018/0331153 A1* | 11/2018 | Robin | H01L 25/167 |

FOREIGN PATENT DOCUMENTS

| EP | 3 401 958 A1 | 11/2018 |
| FR | 3 073 669 A1 | 5/2019 |
| WO | WO 2017/194845 A1 | 11/2017 |

OTHER PUBLICATIONS

Preliminary Search Report for French Application No. 2005712, dated Jan. 28, 2021.

* cited by examiner

*Primary Examiner* — Robert K Carpenter
(74) *Attorney, Agent, or Firm* — Wolf, Greenfield & Sacks, P.C.

(57) ABSTRACT

An optoelectronic device manufacturing method including the steps of: a) forming an active diode stack including first and second of opposite conductivity types; b) forming an integrated control circuit including a plurality of elementary control cells each including at least one MOS transistor; c) after steps a) and b), transferring the integrated control circuit onto the upper surface of the active diode stack; and d) after step c), forming trenches extending vertically through the integrated control circuit and emerging into or onto the first layer and delimiting a plurality of pixels each including a diode and an elementary control cell.

16 Claims, 5 Drawing Sheets

METHOD OF MANUFACTURING AN OPTOELECTRONIC DEVICE COMPRISING A PLURALITY OF DIODES

CROSS-REFERENCE TO RELATED APPLICATION

This application claims priority to French patent application number 2005712, filed May 29, 2020, the contents of which is incorporated by reference in its entirety.

TECHNICAL BACKGROUND

The present disclosure concerns the field of optoelectronic devices. It more specifically concerns a method of manufacturing an optoelectronic device comprising a plurality of semiconductor diodes, for example, gallium nitride diodes, and an electronic circuit for controlling these diodes.

PRIOR ART

An emissive display device comprising an array of gallium nitride (GaN) light-emitting diodes (LEDs), and a control circuit enabling to individually control the LEDs to display images, have already been provided.

To form such a device, it may be provided to separately manufacture the control circuit and the LED array, and then to hybridize them, that is, to stack them while connecting them to each other.

A disadvantage of such a manufacturing method is the need to accurately align the control circuit and the LED array during the step of assembly of the two elements, so that each LED is effectively positioned on a metal pad corresponding thereto in the control circuit. Such an alignment is particularly difficult to achieve when the pitch between pixels decreases, and is an obstacle to an increase in the resolution and/or in the integration density of the pixels.

To overcome this disadvantage, it has been provided, in international patent application WO2017194845 filed by the applicant on May 13, 2016, as well as in French patent application FR3073669 filed by the applicant on Nov. 10, 2017, to:

first form the control circuit in the form of an integrated circuit comprising, on a surface, a plurality of metal pads intended to be connected to the LEDs to be able to individually control the current flowing through each LED;

then place on the surface of the control circuit comprising the metal pads an active LED stack continuously extending over the entire surface of the control circuit; and then structure the active LED stack from its surface opposite to the control circuit, to delimit and isolate from one another the different LEDs of the device.

An advantage of such a manufacturing method is that, during the step of transfer of the active LED stack onto the control circuit, the positions of the different LEDs of the device in the active stack have not been defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that can be obtained on transfer of a substrate onto another one.

It has further been provided, in French patent application FR3065322 filed by the applicant on Apr. 18, 2017, to:

form an array of LEDs each comprising electrodes accessible from a back side of the array;

placing, on the back side of the LED array, a stack of layers comprising at least one semiconductor layer, a dielectric gate layer, and a layer of conductive gate material; and then forming from the stack of layers a control circuit coupled to the electrodes of the LEDs.

Here again, an advantage of such a manufacturing method is that, during the step of transfer of the stack of layers onto the LED array, the positions of the components of the control circuit and of the metallizations of connection of the control circuit to the LED array are not defined yet. There is accordingly no strong alignment accuracy constraint during the transfer. The forming of the components of the control circuit and of the metallizations of connection of the control circuit to the LED array may then be performed by integrated circuit manufacturing methods, which provide an alignment accuracy much greater than the accuracy that can be obtained during a transfer of a substrate onto another.

It has further been recently provided, in French patent application FR1873315 filed by the applicant on Dec. 19, 2018, to:

form an active LED stack extending continuously all over the surface of the display device;

transfer a semiconductor layer onto the upper surface of the active LED stack and then form, inside and on top of the semiconductor layer, a plurality of MOS transistors; and form trenches extending vertically through the semiconductor layer and at least a portion of the thickness of the active LED stack, the trenches delimiting a plurality of pixels, each comprising a LED and at least one MOS transistor for controlling the LED.

Here again, there is no strong alignment accuracy constraint during the transfer. The forming of the MOS control transistors and of the pixel delimitation trenches can then be performed by integrated circuit manufacturing methods, which provide a high alignment accuracy.

It would however be desirable to at least partly improve certain aspects of the optoelectronic device manufacturing methods described in the above-mentioned patent applications.

SUMMARY

An embodiment provides an optoelectronic device manufacturing method, comprising the steps of:

a) forming an active diode stack comprising a first doped semiconductor layer of a first conductivity type and a second doped semiconductor layer of the second conductivity type, coating the upper surface of the first layer;

b) forming an integrated control circuit comprising a plurality of elementary control cells, each comprising at least one MOS transistor;

c) after steps a) and b), transferring the integrated control circuit onto the upper surface of the active diode stack; and d) after step c), forming, from the surface of the integrated control circuit opposite to the active diode stack, trenches extending vertically through the integrated control circuit and emerging into the first layer or onto the upper surface of the first layer and delimiting a plurality of pixels, each comprising a diode and an elementary control cell.

According to an embodiment, in top view, the trenches form a continuous gate separating the pixels of the device from one another.

According to an embodiment, the method comprises a step of filling of trenches with metal to form a metallization of contact with the first semiconductor layer, common to all the pixels of the device.

According to an embodiment, before the filling of the trenches with metal, an insulation layer is deposited on the lateral walls of the trenches.

According to an embodiment, at step b), the third semiconductor layer is removed from the trench-forming areas.

According to an embodiment, the third semiconductor layer is not removed from the trench-forming areas before step d).

According to an embodiment, the method further comprises, after step c), a step of forming, in each pixel, of a metallization of contact with the second semiconductor layer, and of a metallization of contact with the third semiconductor layer.

According to an embodiment, the metallization of contact with the second semiconductor layer and the metallization of contact with the third semiconductor layer are separate metallizations, connected to each other by a conductive track in contact with the upper surfaces of said metallizations.

According to an embodiment, the metallization of contact with the second semiconductor layer and the metallization of contact with the third conductive layer are confounded and are arranged in a same opening crossing the third semiconductor layer.

According to an embodiment, the method further comprises, before step c), a step of deposition of a metal layer on top of and in contact with the surface of the second semiconductor layer opposite to the first semiconductor layer.

According to an embodiment, the method further comprises, before step c), the forming of a conductive or semiconductor ground plane between the second semiconductor layer and the third semiconductor layer, the ground plane being insulated from the second and third semiconductor layers.

According to an embodiment, the method comprises a step of forming, in each pixel, of a metallization of contact with the ground plane, said metallization being arranged in an opening crossing the third semiconductor layer.

According to an embodiment, at step c), the integrated control circuit is transferred so that the gates of the MOS transistors are oriented opposite to the upper surface of the active diode stack.

According to an embodiment, at step c), the integrated control circuit is transferred so that the gates of the MOS transistors are oriented towards the active diode stack.

According to an embodiment, the first and second semiconductor layers are layers based on III-V semiconductor materials, and the third semiconductor layer is made of silicon.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the complete forming of the circuit for controlling the described devices has not been detailed, the forming of such a circuit being within the abilities of those skilled in the art based on the indications of the present disclosure. Further, the composition and the layout of the different layers of an active semiconductor diode stack have not been detailed, the described embodiments being compatible with usual active stacks of semiconductor diodes, particularly gallium nitride diodes.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 to 8 are cross-section views schematically and partially illustrating successive steps of an example of a method of manufacturing an optoelectronic device according to an embodiment. It should be noted that in FIGS. 1 to 8, only one pixel of the device is entirely shown, it being understood that in practice, a large number of pixels are simultaneously formed on a same support substrate.

Figure 1:
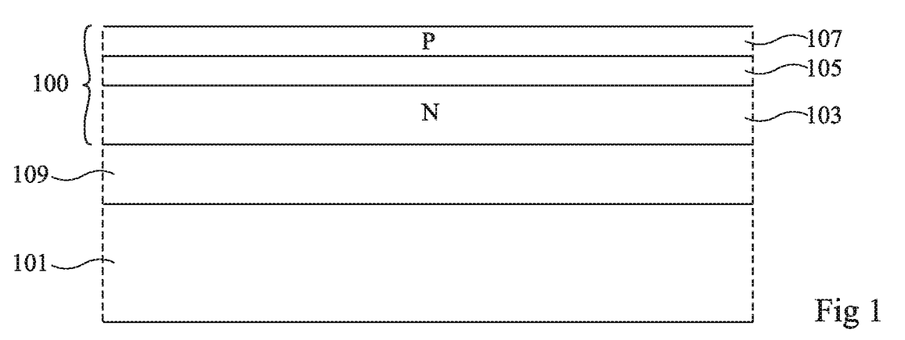
FIG. 1 illustrates a step of an optoelectronic device manufacturing method according to an embodiment.

FIG. 1 shows an initial structure comprising an active LED stack 100 arranged on the upper surface of a support substrate 101. Substrate 101 is for example made of silicon, of sapphire, of corundum, or of any other material on which an active LED stack can be deposited. In the shown example, active stack 100 comprises, in the following order, starting from the upper surface of substrate 101, an N-type doped semiconductor layer 103, an emissive layer 105, and a P-type doped semiconductor layer 107. Semiconductor layers 103 and 107 are for example made of gallium nitride (GaN). Emissive layer 105 is for example formed by a stack of quantum wells, for example, based on gallium nitride and/or on indium-gallium nitride (InGaN). In this example, the lower surface of emissive layer 105 is in contact with the upper surface of layer 103, and the upper surface of emissive layer 105 is in contact with the lower surface of layer 107. In practice, according to the nature of substrate 101, a stack 109 of one or a plurality of buffer layers, for example, based on aluminum nitride (AlN), on aluminum gallium nitride (AlGaN), and/or on gallium nitride, may form an interface between support substrate 101 and layer 103. At this stage, each of layers 103, 105, and 107 of active stack 100 extends continuously and has a substantially uniform thickness over substantially the entire surface of substrate 101. As an example, the thickness of semiconductor layer 103 is in the range from 100 nm to 3 μm, for example, in the order of 700 nm. The thickness of emissive layer 105 may be in the range from 10 to 200 nm, for example, in the order of 100 nm. The thickness of semiconductor layer 107 is for example in the range from 50 to 300 nm, for example, in the order of 100 nm.

Figure 2:
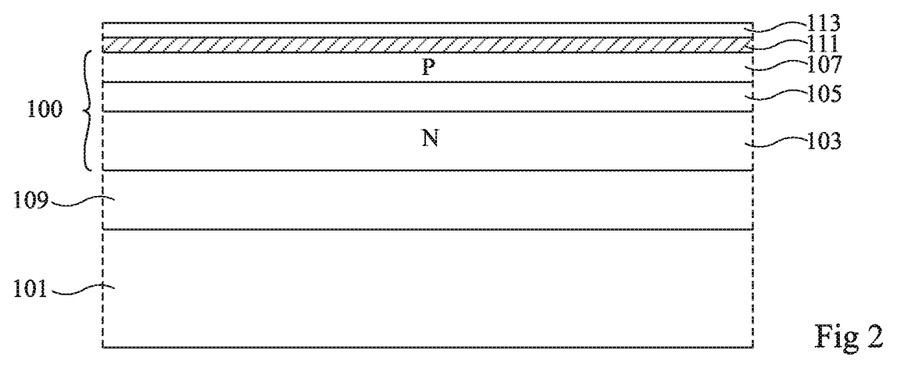
FIG. 2 illustrates another step of an optoelectronic device manufacturing method according to an embodiment.

FIG. 2 illustrates a step of deposition of a conductive contact layer 111, for example, a metal layer, on top of and in contact with the upper surface of semiconductor layer 107. Layer 111 is for example made of aluminum. The thickness of layer 111 is for example in the range from 5 to 200 nm, for example, in the order of 100 nm.

FIG. 2 further illustrates a step of deposition of a dielectric bonding layer 113 on the upper surface of conductive layer 111, for example, in contact with the upper surface of conductive layer 111. Layer 113 is for example made of silicon oxide.

At this stage, each of layers 111 and 113 extends continuously and has a substantially uniform thickness over substantially the entire upper surface of substrate 101.

Figure 3:
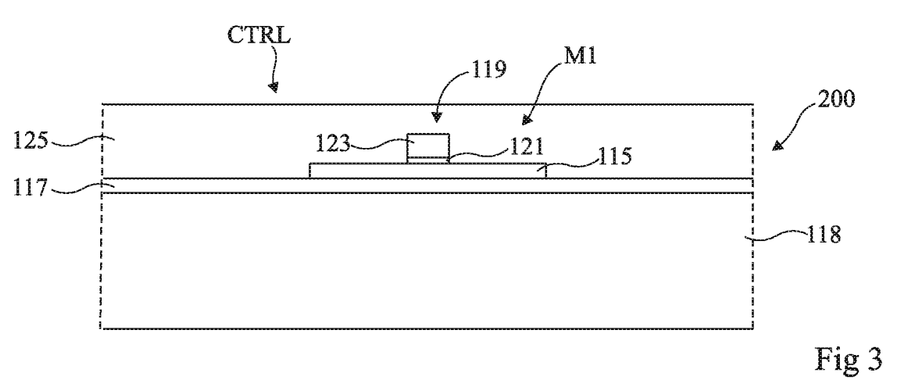
FIG. 3 illustrates another step of an optoelectronic device manufacturing method according to an embodiment.

FIG. 3 illustrates a parallel step of forming of an integrated control circuit 200 comprising, for each pixel of the device, an elementary control cell CTRL intended to be connected to the pixel LED to enable to individually control the current flowing through the pixel LED and thus the light intensity emitted by the pixel LED. Each elementary control cell CTRL particularly comprises at least one MOS transistor M1 intended to be connected to an electrode of the pixel LED. The electric diagram of elementary control cells CTRL has not been shown and will not be detailed herein, the described embodiments being compatible with all known electric diagrams of elementary control cells of a LED emissive display device.

The step of FIG. 3 may be implemented before, during, or after the steps of FIGS. 1 and 2.

During the step of FIG. 3, the transistors M1 of control circuit 200 are formed inside and on top of a semiconductor layer 115, for example, made of silicon. In the shown example, layer 115 rests on top of and in contact with the upper surface of a dielectric layer 117, for example, made of silicon oxide. Dielectric layer 117 rests on top of and in contact with the upper surface of a support substrate 118, for example, made of silicon. The assembly comprising substrate 118, dielectric layer 117, and upper semiconductor layer 115 forms an SOI-type structure (semiconductor on insulator).

As an example, layers 118, 117, and 115 initially extend continuously over the entire surface of control circuit 200.

The method of manufacturing the control circuit 200 illustrated in FIG. 3 may comprise a step of local removal of semiconductor layer 115, for example, by photolithography and etching, stopping inside or on top of the upper surface of dielectric layer 117. This step enables to delimit in layer 115, in each pixel of the display device, one or a plurality of semiconductor wells intended to each contain one or a plurality of MOS transistors of the elementary pixel control cell.

The method illustrated in FIG. 3 may further comprise a step of forming of the gates of the MOS transistors of the control circuit. To achieve this, a gate stack 119 is formed above the channel region of each of the MOS transistors of the control circuit. Gate stack 119 comprises a gate insulator layer 121, for example, made of silicon oxide, arranged on top of and in contact with the upper surface of semiconductor layer 115, and a conductive layer 123, for example, made of doped polysilicon or of metal, arranged on top of and in contact with the upper surface of dielectric layer 121. Gate stack 119 is for example first continuously deposited all over the surface of substrate 101, and then locally removed, for example by photolithography and etching, opposite the source and drain regions of the transistors.

It should be noted that the order of the above-mentioned steps of local etching of semiconductor layer 115 and of forming of the transistor gates may be inverted. Further, the forming of the transistors of the control circuit of the display device may comprise many other steps, not detailed herein, for example, of implantation of the source, drain, and/or channel regions of the transistors, of forming of spacers, of silicidation of the upper surface of the source, drain, and/or gate contact regions of the transistors, etc.

FIG. 3 further illustrates a step subsequent to the manufacturing of the MOS transistors of the control circuit, where a layer 125 of a dielectric material is deposited on the upper surface of the assembly. Layer 125, also called pre-metal dielectric layer, for example extends continuously over substantially the entire surface of the device. The thickness of layer 125 is preferably greater than the sum of the thicknesses of semiconductor layer 115 and of gate stack 119. As an example, the thickness of layer 125 is in the range from 100 nm to 700 nm.

It can already be noted that as compared with the methods described in the above-mentioned patent applications FR3065322 and FR1873315, an advantage of the method of FIGS. 1 to 8 is that the thermal budget for the forming of the MOS transistors of circuit 200 is not limited by the presence of the active LED stack. Indeed, conversely to the methods described in the above-mentioned patent applications FR3065322 and FR1873315 where the MOS transistors of the control circuit are formed inside and on top of a semiconductor layer previously placed on the active LED stack, in the method of FIGS. 1 to 8, the MOS transistors of circuit 200 are formed separately from the active LED stack.

After the steps of FIGS. 1, 2, and 3, circuit 200 is transferred onto the upper surface of active LED stack 100.

Figure 4:
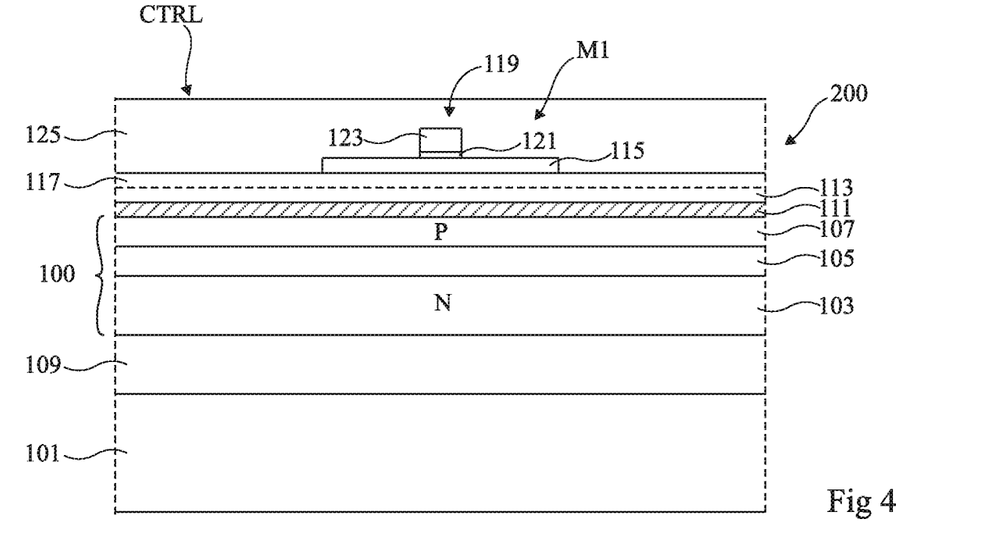
FIG. 4 illustrates another step of an optoelectronic device manufacturing method according to an embodiment.

FIG. 4 illustrates the structure obtained at the end of this transfer step.

In this example, circuit 200 is first attached, by its upper surface (on the side of dielectric layer 125), to a temporary support handle (not shown), and then thinned from its lower surface to totally remove substrate 118. The assembly comprising the support handle and circuit 200 is then transferred onto the upper surface of dielectric layer 113, to place the lower surface of dielectric layer 117 into contact with the upper surface of dielectric layer 113. A direct bonding or molecular bonding of layer 117 onto layer 113, enabling to fasten circuit 200 to layer 113, is then performed. The temporary support handle is then removed to free the access to the upper surface of control circuit 200.

It should be noted that the described embodiments are not limited to the above-described specific case where control circuit 200 is formed inside and on top of a SOI-type structure. As a variant, circuit 200 may be formed inside and on top of a solid semiconductor substrate. After the step of thinning of the substrate from its lower surface (that is, opposite to the MOS transistors), a dielectric layer may then be deposited on the lower surface of the substrate, to allow a direct dielectric-to-dielectric bonding of control circuit 200 to layer 113. As a variant, a contact level may be formed before the transfer.

Figure 5:
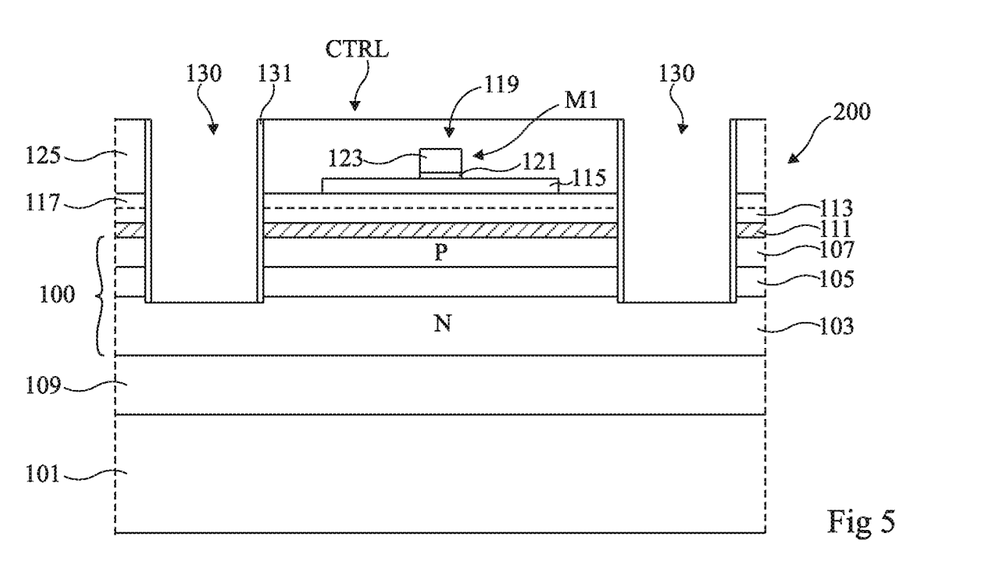
FIG. 5 illustrates another step of an optoelectronic device manufacturing method according to an embodiment.

FIG. 5 illustrates a step of etching of trenches 130 vertically extending from the upper surface of dielectric layer 125 towards the lower surface of the substrate. At this step, the etching of trenches 130 is interrupted in the lower semiconductor layer 103 of active LED stack 100 or on the upper surface of lower semiconductor layer 103. Trenches 130 delimit islands or mesas, each corresponding to a pixel of the device, it being understood that each pixel comprises an individually-controllable LED (that is, controllable independently from the other LEDs of the device) and an elementary LED control cell CTRL. Thus, trenches 130 delimit, in active LED stack 100, a plurality of individually-controllable LEDs and, in circuit 200, a plurality of corresponding elementary control cells CTRL, each elementary control cell CTRL being intended to control the underlying LED. In top view, the pixels of the device may be arranged in an array, trenches 130 forming a continuous gate such that each pixel is totally surrounded with trenches 130, and such that two neighboring pixels are separated from each other by a trench 130. The alignment of trenches 130 may for example be performed with respect to alignment marks previously formed on control circuit 200.

It should be noted that in the present example, semiconductor layer 115 has been previously removed, during the step of FIG. 3, from the areas where trenches 130 are formed. The etching of trenches 130 thus does not cross semiconductor layer 115. The described embodiments are however not limited to this specific case.

FIG. 5 further illustrates a step of forming of insulating spacers 131, for example, made of silicon oxide or of silicon nitride, on the lateral walls of trenches 130. As an example, to form spacers 131, a layer of an insulating material is first continuously deposited over the entire upper surface of the assembly, for example, by a conformal deposition method, after which the horizontal portions of the insulating layer are removed, for example, by vertical anisotropic etching, to only keep the portions of the insulating layer located on the lateral walls of the trenches, such portions forming spacers 131.

Figure 6:
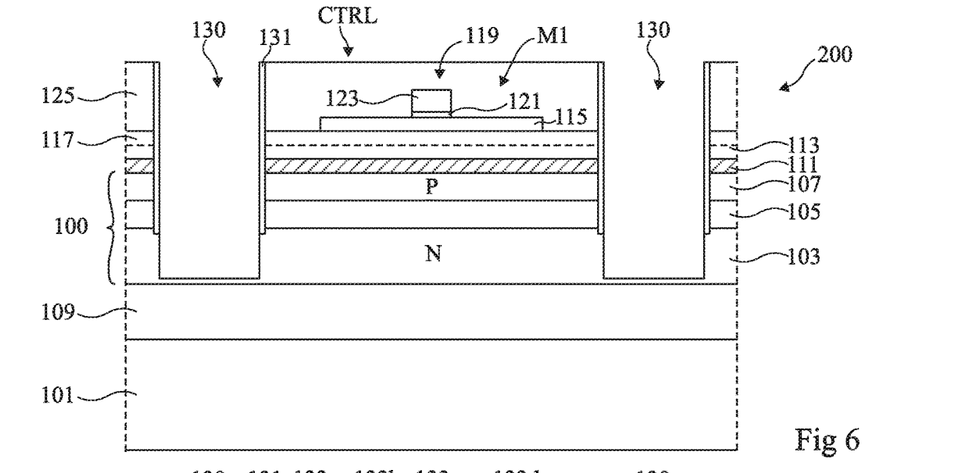
FIG. 6 illustrates another step of an optoelectronic device manufacturing method according to an embodiment.

FIG. 6 illustrates a step of extension of trenches 130 into the lower semiconductor layer 103 of the LED stack. In the shown example, the etching is interrupted before reaching the lower surface of layer 103, that is, trenches 130 do not totally cross layer 103. As a variation, trenches 130 may totally cross layer 103. During this step, the sides of anode contact conductive layer 111 and of layers 107 and 105 are protected from the etching by spacers 131.

Figure 7:
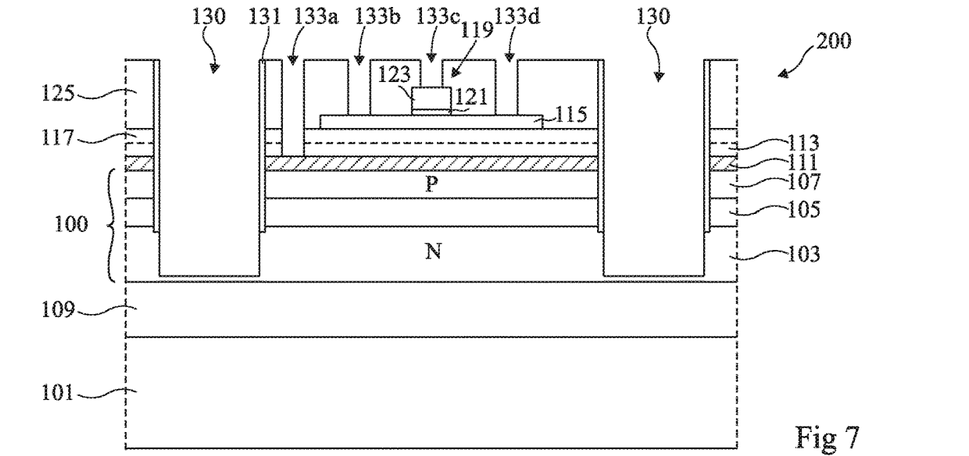
FIG. 7 illustrates another step of an optoelectronic device manufacturing method according to an embodiment.

FIG. 7 shows a step of forming, in each pixel of the device, contacting openings extending vertically from the upper surface of dielectric layer 125 towards the lower surface of the substrate, and emerging onto source, gate, and drain contact regions of the MOS transistors and onto the anode contact conductive layer 111 of the pixel. In the example of FIG. 7, an opening 133a emerging onto the upper surface of anode contact layer 111 of the pixel, an opening 133b emerging onto the upper surface of semiconductor layer 115, onto a first conduction region (source or drain) of a MOS transistor of the pixel, an opening 133c emerging onto the upper surface of the conductive gate layer 123 of a MOS transistor of the pixel, and an opening 133d emerging onto the upper surface of semiconductor layer 115, onto a second conduction region (drain or source) of a MOS transistor of the pixel, have been more particularly shown in each pixel.

Openings 133a, 133b, 133c, 133d may be formed during a same photolithography and etch step. The described embodiments are however not limited to this specific case. It should be noted that, in the present example, semiconductor layer 115 has been previously removed, during the step of FIG. 3, from the areas where openings 133a are formed. The etching of openings 133a thus does not cross semiconductor layer 115. The described embodiments are however not limited to this specific case. Further, although this has not been shown in the drawings, the upper surfaces of the source, drain, and possibly gate (in the case where the gates are made of polysilicon) contacting areas of the transistors may have been previously silicided during the manufacturing steps of FIG. 3, which enables to ease the stopping of the etching of openings 133b, 133c, and 133d, and to decrease the resistances of access to the source, drain, and possibly gate regions of the transistors.

Figure 8:
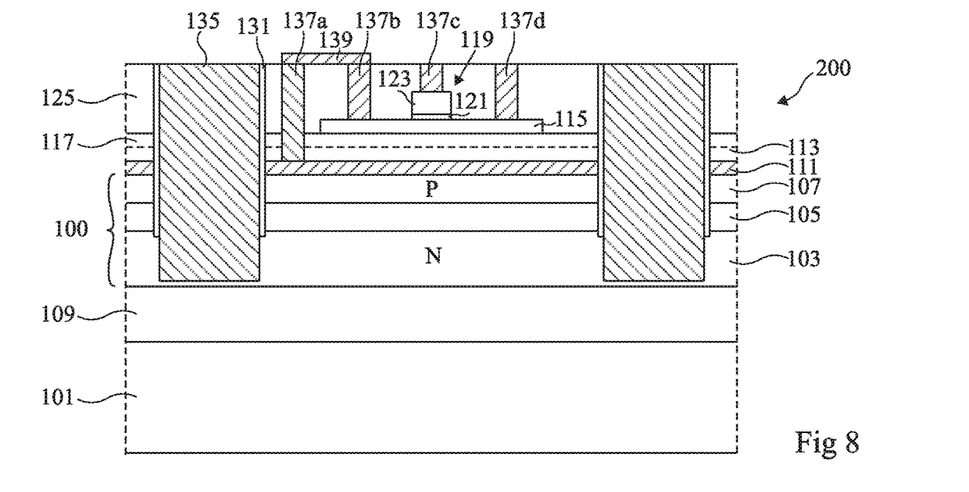
FIG. 8 illustrates another step of an optoelectronic device manufacturing method according to an embodiment.

FIG. 8 illustrates a step of filling of trenches 130 with metal, for example, copper, to form a cathode contact metallization 135 common to all the LEDs of the display device. In the present example, the trenches are totally filled with metallization 135. Metallization 135 is in contact with layer 103 at the bottom and over a lower portion of the lateral walls of trenches 130. Metallization 135 is however insulated from layers 105, 107, and 111 by spacers 131.

FIG. 8 further illustrates a step of filling of openings 133a, 133b, 133c, and 133d with metal, for example, tungsten, to form:

in each opening 133a, an anode contact metallization 137a specific to the underlying LED,
in each opening 133b, a source or drain contact metallization 137b specific to the underlying transistor;
in each opening 133c, a gate contact metallization 137c specific to the underlying transistor; and
in each opening 133d, a drain or source contact metallization 137d specific to the underlying transistor.

Metallizations 137a, 137b, 137c, 137d may be formed simultaneously. The described embodiments are however not limited to this specific case. Metallizations 137a, 137b, 137c, 137d may be formed before, at the same time as, or after metallization 135. It should be noted that the described embodiments are not limited to the shown example where the upper surface of metallization 135 and the upper surfaces of metallizations 137a, 137b, 137c, 137d are in a same plane. As a variant, metallization 135 and metallizations 137a, 137b, 137c, 137d may have different heights.

FIG. 8 further illustrates an optional step of forming, in each pixel, on the upper surface of dielectric layer 125, of a conductive connection element 139, for example, a metal track, connecting the anode contact metallization 137a of the pixel to a source or drain contact metallization 137b of a MOS transistor of the elementary pixel control cell. Connection element 139 is for example a copper track arranged on the upper surface of the assembly, in contact by its lower surface, on the one hand, with the upper surface of metallization 137a and, on the other hand, with the upper surface of metallization 137b.

Other conductive interconnection tracks (not shown) may be provided to, in each pixel, connect one or a plurality of contact metallizations of the pixel to a peripheral or external circuit for controlling the device.

The display device thus formed is intended to emit light through its lower surface. As an example, substrate 101 is a transparent substrate, for example, made of sapphire, which enables not to block the passage of light. It should be noted that to increase its transparency, substrate 101 may be thinned or even removed. A support handle, for example, in the form of a silicon substrate, may possibly be fastened to the upper surface of the assembly before the thinning or the removal of substrate 101, to ensure the mechanical resistance of the assembly.

As compared with the method described in above-mentioned French patent application FR3065322, an advantage is that the transfer of semiconductor layer 115 onto the upper surface of the active LED stack is simplified by the fact that the active LED stack has not been structured yet at the time of the transfer. It is in particular possible to perform the transfer with a dielectric interface layer (stack of layers 113 and 117) of very small thickness, for example, smaller than 50 nm.

Further, as indicated hereabove, as compared with the methods described in the above-mentioned patent applications FR3065322 and FR1873315, an advantage of the method of FIGS. 1 to 8 is that the thermal budget for the forming of the control circuit is not limited by the presence of the active LED stack.

Further, as compared with the methods described in the above-mentioned patent applications WO2017194845 and FR3073669, an advantage of the above-described method results from the fact that trenches 130 for delimiting the LEDs are formed from the upper surface of the LED stack facing the control circuit or, in other words, from the surface of the LED stack opposite to support substrate 101. This enables to ease the achieving of an electric contact of good quality on layer 103, without short-circuiting layers 105 and 107. It should in particular be noted that in the method described in patent application WO2017194845, the contact is taken by the surface of layer 103 opposite to the control circuit, which decrease the LED illumination surface area. The method described in patent application FR3073669 comprises a touchy step of partial removal of a spacer previously formed in the delimitation trench of each LED.

It should further be noted that in an active LED stack of the type described hereabove, the crystalline quality of the upper portion (in the orientation of FIG. 8) of layer 103 is generally better than that of the lower portion of layer 103. As a result, in the above-described method, the etching of layer 103 during the forming of trenches 130 is easier than the etching of this same layer in the methods described in the above-mentioned patent applications WO2017194845 and FR3073669.

Although an embodiment where the electronic LED control circuit is formed in a single semiconductor level, corresponding to semiconductor layer 115, has been described hereabove, the described embodiments are not limited to this specific case. As a variant, a second semiconductor level may be provided above dielectric layer 125, having other elements of the LED control circuits formed therein. In this case, the transistors of higher power supply voltage of the control circuit are preferably formed in the first semiconductor level (that is, at closest to the LEDs), and the transistors of lower power supply voltage may be located in the second semiconductor level. The second semiconductor level may be formed in a so-called 3D sequential technology, that is, by deposition or transfer of an additional semiconductor layer onto the upper surface of dielectric layer 125, and then forming of MOS transistors inside and on top of the additional semiconductor layer. As a variant, the second semiconductor level may be formed in so-called parallel 3D technology, that is, formed separately from the device of FIG. 8, and then hybridized with the upper surface of the device of FIG. 8. A conductive ground plane may possibly be provided between the first and second semiconductor levels.

Figure 9:
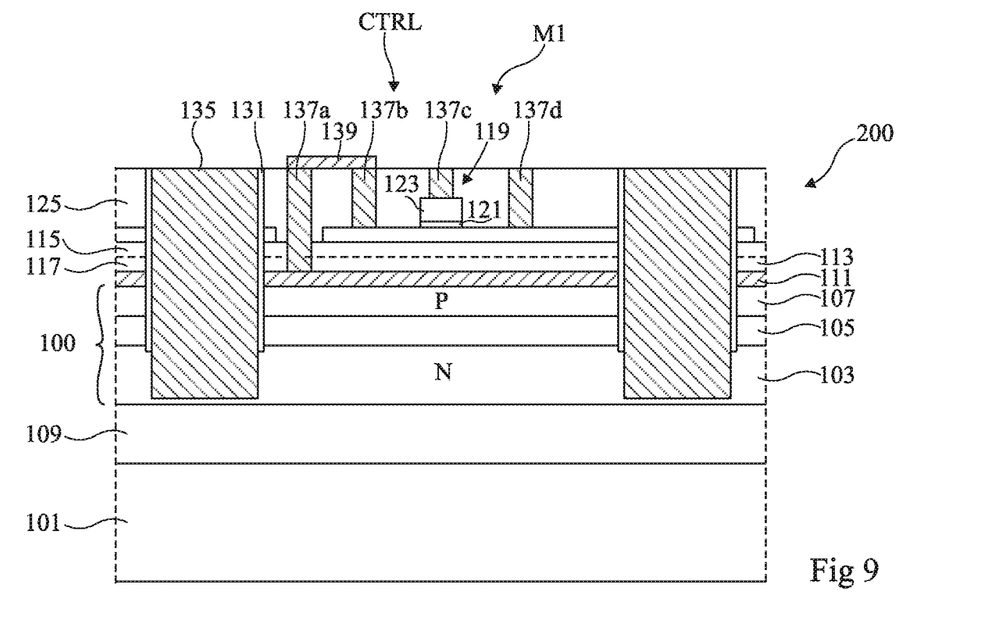
FIG. 9 illustrates a first variant of the method of FIGS. 1 to 8.

FIG. 9 is a cross-section view schematically illustrating a first alternative embodiment of the method of FIGS. 1 to 8.

The variant of FIG. 9 differs from the method of FIGS. 1 to 8 mainly in that, in this variant, the insulation pattern of the MOS transistors formed inside and on top of semiconductor layer 115 and the insulation pattern of the LEDs are self-aligned. In other words, in the variant of FIG. 9, it is not provided to delimit semiconductor wells in layer 115 prior to the transfer of circuit 200 onto the active LED stack and to the forming of trenches 130, as previously described in relation with FIG. 3.

Thus, in the variant of FIG. 9, during the step of local etching of semiconductor layer 115 (FIG. 3), layer 115 is only removed from the areas of subsequent forming of openings 133a.

In the variant of FIG. 9, in each pixel, all the MOS transistors of the pixel formed inside and on top of semiconductor layer 115 share a same active area. The dimension of the pixels can thus be decreased. As an example, in the variant of FIG. 9, in each pixel, a single MOS transistor with a high power supply voltage, for example, a power supply voltage in the range from 3 to 15 volts, is formed inside and on top of the portion of semiconductor layer 115 of the pixel, this transistor substantially occupying the same surface area as the pixel LED. Each pixel may further comprise transistors having a lower power supply voltage, for example, a power supply voltage in the range from 0.5 to 5 volts, formed in a second semiconductor level (not shown) above semiconductor layer 115.

Figure 10:
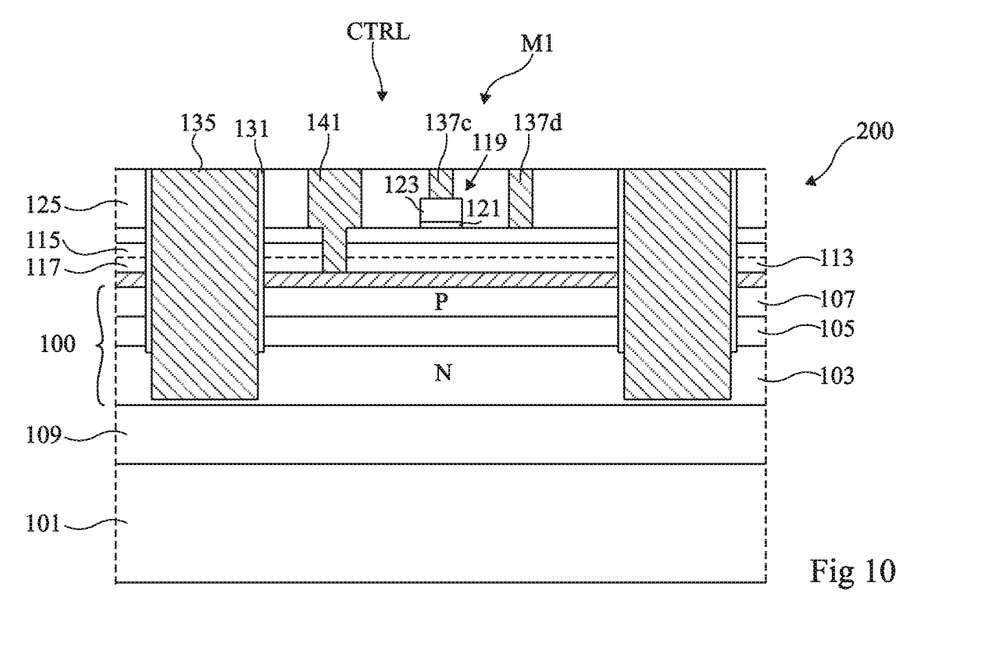
FIG. 10 illustrates a second variant of the method of FIGS. 1 to 8.

FIG. 10 is a cross-section view schematically illustrating a second alternative embodiment of the method of FIGS. 1 to 8.

The variant of FIG. 10 differs from the method of FIGS. 1 to 8 mainly in that, in this variant, in each pixel, instead of providing an anode contact metallization 137a and a source or drain contact metallization 137b connected by a conductive track 139, a single shared contact metallization 141 crossing semiconductor layer 115 and connecting the source or drain region of the MOS transistor to the anode contact conductive layer 111 of the pixel is provided.

In this variant, semiconductor layer 115 is not removed from the area where shared contact metallization 141 is formed at the step of FIG. 3.

The forming of shared contact metallization 141 for example comprises the following successive steps (not detailed in FIG. 10):

forming, from the upper surface of dielectric layer 125, a first opening extending vertically to the upper surface of semiconductor layer 115 (preferably on a previously silicided region of the upper surface of layer 115);

forming on the lateral walls of the first opening spacers made of a sacrificial material;

continuing the first opening with a second opening of small lateral dimension (due to the presence of the sacrificial spacers) crossing semiconductor layer 115 and extending vertically all the way to the upper surface of anode contact layer 111;

removing the sacrificial spacers;

filling the first and second openings with metal, for example, tungsten, to form metallization 141.

The metallization 141 thus formed is in contact with the upper surface of semiconductor layer 115 at the bottom of the first opening and with the upper surface of anode contact layer 111 at the bottom of the second opening.

As a variant (not shown), the opening having metallization 141 arranged therein may be formed in a single step, in which case metallization 141 is in contact with semiconductor layer 115 only by the sides of layer 115.

The variant of FIG. 10 enables to gain pixel integration density.

It should be noted that the variants of FIGS. 9 and 10 may be combined, as illustrated in FIG. 10. In this case, the step of local etching of semiconductor layer 115 of FIG. 3 may be omitted. As a variant, the shared contact metallization 141 described in relation with FIG. 10 may be provided in a device of the type shown in FIG. 8, that is, where the MOS transistor insulation pattern formed inside and on top of semiconductor layer 115 and the LED insulation pattern are not self-aligned.

Figure 11:
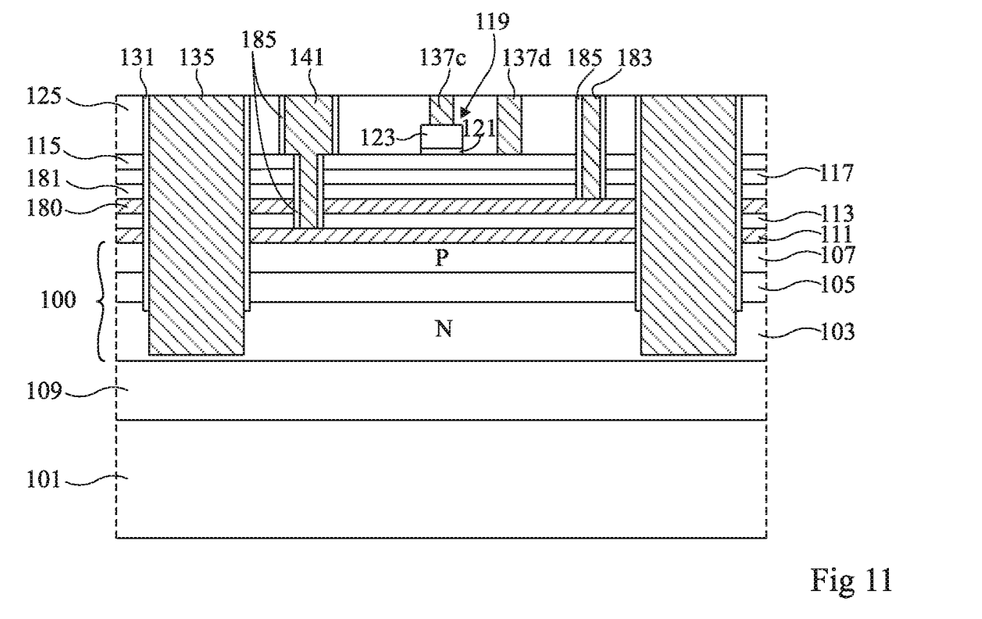
FIG. 11 illustrates a third variant of the method of FIGS. 1 to 8.

FIG. 11 is a cross-section view schematically illustrating a third alternative embodiment of the method of FIGS. 1 to 8.

The variant of FIG. 11 differs from what has been previously described mainly in that the device further comprises, in each pixel, between anode contact semiconductor conductive layer 111 and semiconductor layer 115, a ground plane 180 formed by a layer of a conductive or semiconductor material, for example, a doped polysilicon layer. In operation, ground plane 180 is maintained at a reference potential of the device, for example, the ground, and enables to decouple the LED from the elementary pixel control cell, and particularly to avoid for the relatively high voltage levels applied to the anode contact level of the LED to induce a modification of the behavior of the transistor(s) of the elementary pixel control cell.

In the shown example, ground plane 180 is arranged between dielectric layer 113 and dielectric semiconductor layer 117, an additional dielectric layer 181, for example, made of silicon oxide, forming an interface between ground plane 180 and dielectric layer 117.

As an example, ground plane 180 and dielectric layer 181 may be successively deposited on the upper surface of layer 113 at the end of the steps of FIGS. 1 and 2. As an example, ground plane 180 and dielectric layer 181 may each extend continuously over the entire surface of layer 113.

The rest of the method is for example identical or similar to what has been previously described, with the difference that:

during the transfer of circuit 200 onto the active LED stack, the attaching of circuit 200 to the active LED stack is performed by direct bonding of dielectric layer 117 to dielectric layer 181;

the contacting metallization on anode contact layer 111 of the LED crosses ground plane 180 and should thus be insulated from ground plane 180; and each pixel comprises an additional contacting metallization 183 for the biasing of ground plane 180.

In the shown example, the additional contacting metallization 183 crosses semiconductor layer 115 and is insulated therefrom by a lateral insulating layer 185, for example, made of silicon oxide.

Further, in this example, contacting metallization 141 is a metallization shared with semiconductor layer 115, similar to what has been described in the example of FIG. 10. However, in the variation of FIG. 11, metallization 141 crosses ground plane 180 and is insulated therefrom by a lateral insulating layer 187, for example, made of silicon oxide.

The variant of FIG. 11 may of course be combined with all the previously-described variants.

Figure 12:
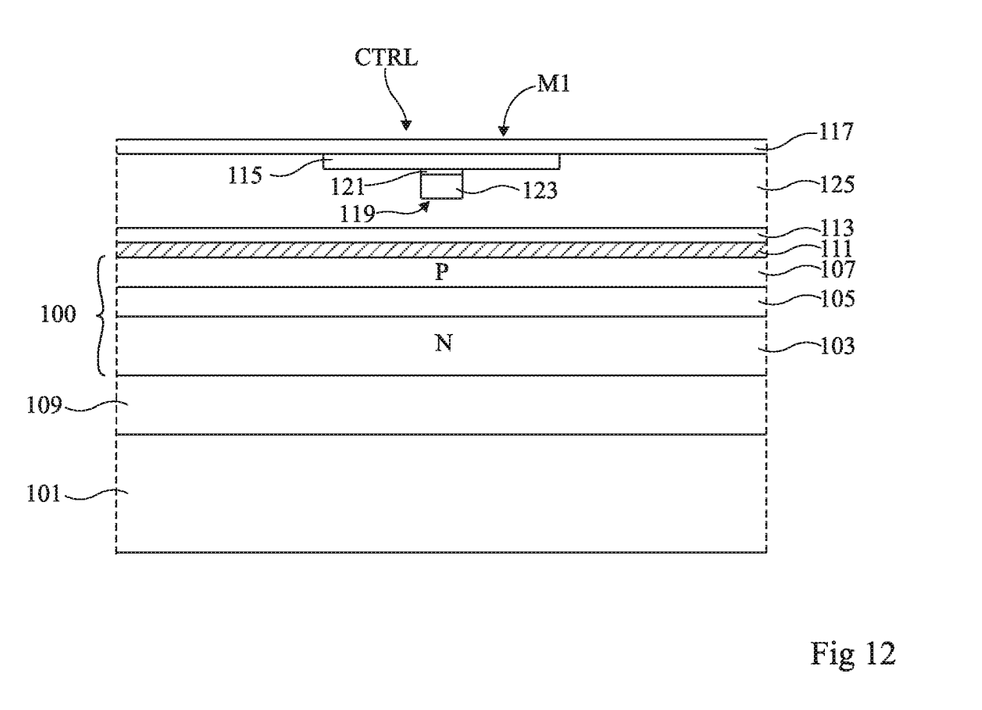
FIG. 12 illustrates a fourth variant of the method of FIGS. 1 to 8.

FIG. 12 is a cross-section view schematically illustrating a fourth alternative embodiment of the method of FIGS. 1 to 8.

The variant of FIG. 12 differs from what has been described previously in that, in this variant, control circuit 200 is transferred onto the active LED stack with its front surface facing the front surface of the active LED stack, and no longer with its rear surface facing the front surface of the active LED stack. Front surface of circuit 200 here means its surface located on the side of gate stack 119, that is, its upper surface in the orientation of FIG. 3. Front surface of the active LED stack here means its surface opposite to substrate 101, that is, its upper surface in the orientation of FIG. 2.

FIG. 12 more particularly illustrates the step of transfer of circuit 200 onto the active LED stack. In this example, circuit 200 is transferred onto the upper surface of dielectric layer 113, to place the surface of dielectric layer 125 opposite to substrate 118 into contact with the upper surface of dielectric layer 113. A direct bonding or molecular bonding of layer 125 onto layer 113, enabling to fasten circuit 200 to layer 113, is then performed. Substrate 118 (or a portion of substrate 118) may then be removed to free the access to the upper surface of layer 117.

The subsequent steps of the method are for example identical or similar to what has been previously described in relation with FIGS. 5 to 8, but for the fact that the contacts on the source, drain, and gate regions of the transistors (FIGS. 7 and 8) are this time formed on the rear surface side of circuit 200. It will in particular be noted that in this variant, the contacts on the gates of the transistors will be transferred to avoid crossing the channel region of the transistors. Steps, not detailed, of silicidation of the rear surface of the semiconductor layer and/or of conductive gate 123 may be provided at the level of the contacting areas.

The variant of FIG. 12 may be combined with all the previously-described variants.

Various embodiments and variants have been described. It will be understood by those skilled in the art that certain features of these various embodiments and variations may be combined, and other variations will occur to those skilled in the art. In particular, the described embodiments are not limited to the above-described examples of materials, nor to the examples of dimensions mentioned hereabove.

Further, the conductivity types of semiconductor layers 103 and 107 of LED stack 100 may be inverted.

Further, although only embodiments of display devices based on LEDs have been described, the described embodiments may be adapted to the manufacturing of a sensor comprising a plurality of photodiodes, for example, made of gallium nitride, individually addressable to acquire an image.

More generally, the described embodiments may be adapted to the manufacturing of any display device or photosensitive sensor based on semiconductor diodes, including based on semiconductor materials other than gallium nitride, for example, diodes based on other III-V semiconductor materials or silicon diodes.

The invention claimed is:

1. Optoelectronic device manufacturing method, comprising the steps of:
   a) forming an active diode stack comprising a first doped semiconductor layer of a first conductivity type and a second doped semiconductor layer of a second conductivity type, coating the upper surface of the first layer;
   b) forming an integrated control circuit comprising a plurality of elementary control cells, each comprising at least one MOS transistor;
   c) after steps a) and b), transferring the integrated control circuit onto the upper surface of the active diode stack;
   d) after step c), forming, from the surface of the integrated control circuit opposite to the active diode stack, trenches extending vertically through the integrated control circuit and emerging into the first layer or onto the upper surface of the first layer and delimiting a plurality of pixels, each comprising a diode and an elementary control cell; and
   e) filling of the trenches with metal to form a common metallization contact such that a first pixel and a second pixel which is adjacent to the first pixel, abut opposing sides of the metallization which delimits the first and second pixels, each of which are pixels of the plurality of pixels.

2. Method according to claim 1, wherein, in top view, the trenches form a continuous gate separating from one another the pixels of the device.

3. Method according to claim 2, wherein the common metallization is in contact with the first semiconductor layer, and wherein the common metallization is common to all the pixels of the device.

4. Method according to claim 3, wherein, before the filling of the trenches with metal, an insulation layer is deposited on the lateral walls of the trenches.

5. Method according to claim 1, wherein the integrated control circuit comprises a third semiconductor layer having the MOS transistors of the elementary control cells formed inside and in top of it.

6. Method according to claim 5, wherein, at step b), the third semiconductor layer is removed from the trench-forming areas.

7. Method according to claim 5, wherein the third semiconductor layer is not removed from the trench-forming areas before step d).

8. Method according to claim 5, further comprising, after step c), a step of forming, in each pixel of a metallization of contact with the second semiconductor layer, and of a metallization of contact with the third semiconductor layer.

9. Method according to claim 8, wherein the metallization of contact with the second semiconductor layer and the metallization of contact with the third semiconductor layer are separate metallizations, connected to each other by a conductive track in contact with the upper surfaces of said metallizations.

10. Method according to claim 8, wherein the metallization of contact with the second semiconductor layer and the metallization of contact with the third conductive layer are connected and are arranged in a same opening crossing the third semiconductor layer.

11. Method according to claim 5, further comprising, before step c), a step of deposition of a metal layer on top of and in contact with the surface of the second semiconductor layer opposite to the first semiconductor layer.

12. Method according to claim 5, further comprising, before step c), the forming of a conductive or semiconductor ground plane between the second semiconductor layer and the third semiconductor layer, the ground plane being insulated from the second and third semiconductor layers.

13. Method according to claim 12, comprising a step of forming, in each pixel, of a metallization of contact with the ground plane, said metallization being arranged in an opening crossing the third semiconductor layer.

14. Method according to claim 5, wherein, at step c), the integrated control circuit is transferred so that the gates of the MOS transistors are oriented opposite to the upper surface of the active diode stack.

15. Method according to claim 5, wherein, at step c), the integrated control circuit is transferred so that the gates of the MOS transistors are oriented towards the active diode stack.

16. Method according to claim 5, wherein the first and second semiconductor layers are layers based on III-V semiconductor materials, and the third semiconductor layer is made of silicon.

* * * * *